United States Patent
Lazar et al.

(10) Patent No.: US 7,053,615 B2
(45) Date of Patent: May 30, 2006

(54) MAGNETIC RESONANCE SYSTEM

(75) Inventors: Razvan Lazar, Erlangen (DE); Jürgen Nistler, Erlangen (DE); Wolfgang Renz, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/514,388

(22) PCT Filed: May 6, 2003

(86) PCT No.: PCT/DE03/01444

§ 371 (c)(1),
(2), (4) Date: Nov. 15, 2004

(87) PCT Pub. No.: WO03/098247

PCT Pub. Date: Nov. 27, 2003

(65) Prior Publication Data

US 2005/0174115 A1    Aug. 11, 2005

(30) Foreign Application Priority Data

May 15, 2002    (DE) ................................ 102 21 636

(51) Int. Cl.
*G01V 3/00*    (2006.01)
(52) U.S. Cl. ...................... 324/318; 324/319
(58) Field of Classification Search ................ 324/418, 324/319, 322, 309, 307, 300; 600/410
See application file for complete search history.

(56) References Cited

U.S. PATENT DOCUMENTS

| | | | |
|---|---|---|---|
| 4,682,112 A | 7/1987 | Beer | 324/318 |
| 5,111,146 A | 5/1992 | Kuhn | 324/322 |
| 5,138,261 A * | 8/1992 | Ratzel | 324/318 |
| 5,216,367 A | 6/1993 | Mori | 324/318 |
| 5,317,266 A | 5/1994 | Meissner | 324/309 |
| 5,642,048 A | 6/1997 | Crozier et al. | 324/318 |
| 5,661,400 A | 8/1997 | Plies et al. | 324/319 |
| 6,252,403 B1 | 6/2001 | Alsop | 324/318 |

FOREIGN PATENT DOCUMENTS

EP    0 463 789    1/1992

OTHER PUBLICATIONS

Reduction of RF Penetration Effects in High Field Imaging, Foo et al., Magnetic Resonance in Medicine, vol. 23, No. 2 (Feb. 1992) pp. 287-301.

* cited by examiner

*Primary Examiner*—Brij B. Shrivastav
(74) *Attorney, Agent, or Firm*—Schiff Hardin LLP

(57) ABSTRACT

A magnetic resonance system has a primary RF transmitting antenna and at least one secondary RF transmitting antenna. Both antennas generate RF excitation fields in an examination volume. At least one of the primary and secondary transmitting antennas has a control element connected thereto, which allows an amplitude ratio and/or a phase difference of the respective excitation currents in the antennas to be set by a control and evaluation device. The control and evaluation device causes the excitation current in the secondary transmitting antenna to have a smaller amplitude than the excitation current in the primary transmitting antenna, so that the excitation field generated by the secondary transmitting antenna has a smaller spatial extent in the examination volume than the excitation field generated by the primary transmitting antenna.

10 Claims, 2 Drawing Sheets

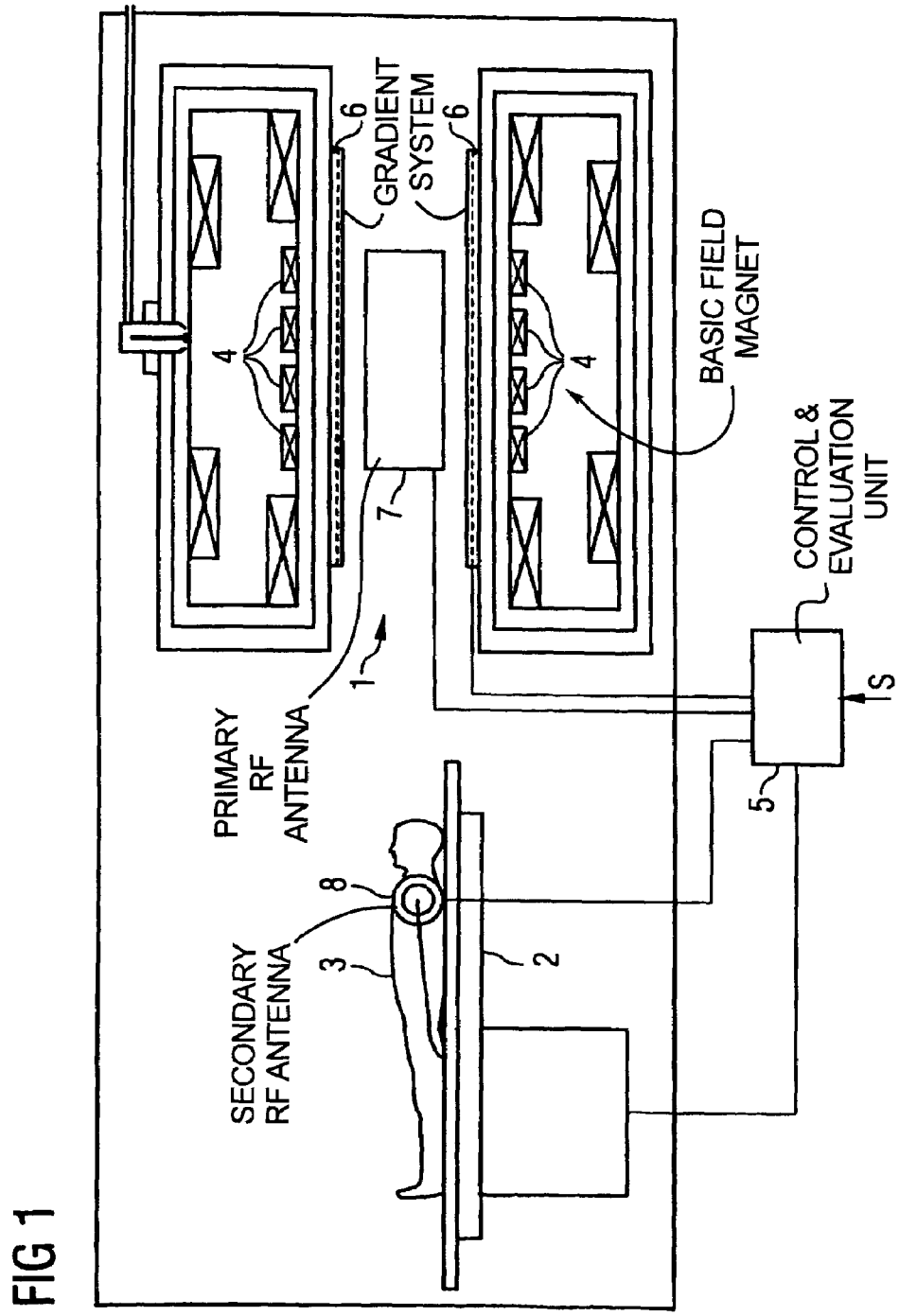

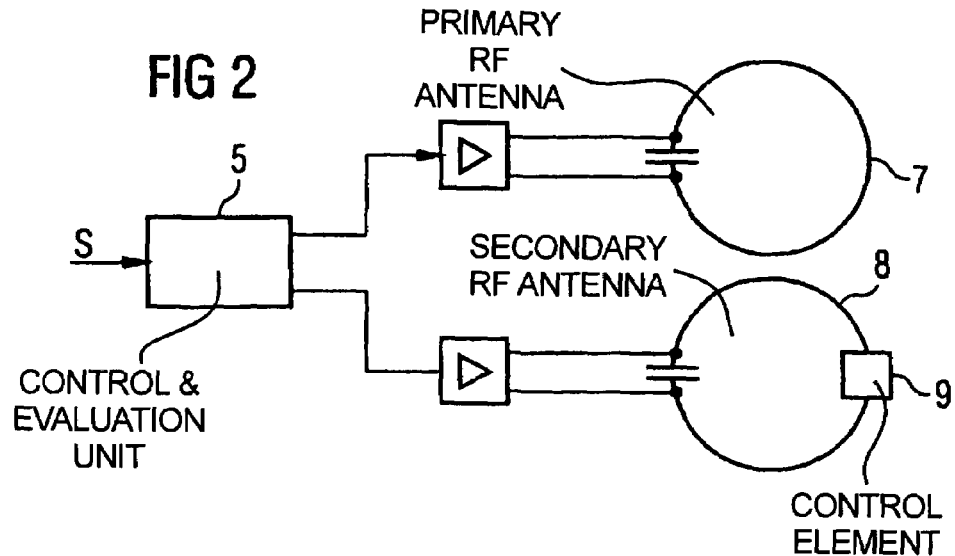
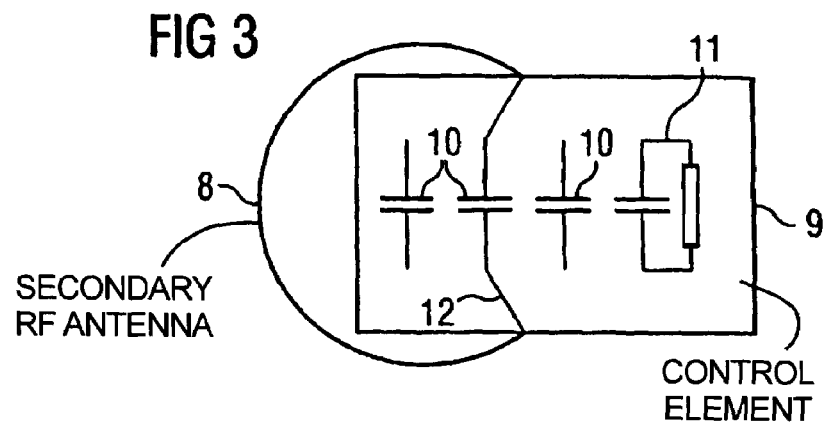
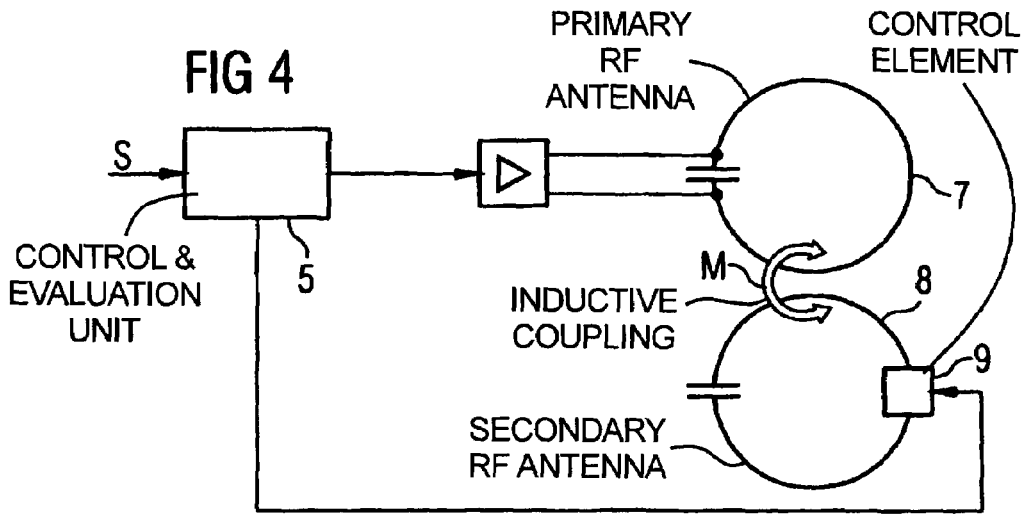

MAGNETIC RESONANCE SYSTEM

BACKGROUND OF THE INVENTION

1. Field of the Invention

The present invention concerns a magnetic resonance system having a basic field magnet, a gradient system, a primary RF transmitting antenna, at least one secondary RF transmitting antenna, at least one RF receiving antenna and a control and evaluation device for operating the gradient system and the antennas and for evaluating he signals therefrom.

2. Description of the Prior Art

Magnetic resonance systems are generally known. The text "Bildgebende Systeme für die medizinische Diagnostik", 3rd edition, 1995, Publicis MCD Verlag, pages 501 through 503, is referenced as an example of a general description of such systems.

The known resonance systems exhibit a basic magnetic field that is normally 1.5 T. A good reconstruction of the examination subject is possible with this magnetic resonance system.

In earlier times, magnetic resonance systems were also produced in which the basic magnetic field exhibited more than 1.5 T, in particular 3 T and more. Better resolutions are achievable with these magnetic resonance systems. However, image inhomogeneities that are caused by radio-frequency eddy currents in the examination subject increasingly occur with such magnetic resonance systems in the prior art.

In the prior art—, for example, U.S. Pat. No. 6,252,403—it is proposed to fashion the transmitting antenna spiral-shaped to compensate such eddy currents. The transmitting antenna thus assumes the shape of a birdcage resonator wound around its axis of symmetry. It is also known from this patent to arrange suitable dielectrics, in particular water, near the examination subject in order to hereby achieve a homogenization of the radio-frequency excitation field. In spite of such endeavors, however, inhomogeneities in the excitation field cannot be sufficiently compensated in all cases.

A magnetic resonance system according to the preamble of the claim 1 is known from U.S. Pat. No. 4,682,112 that has at least one control element that allows setting or adjustment of the amplitude ratio and/or phase offset of the respective excitation currents in the primary and secondary RF antennas. In this magnetic resonance system, the transmitter arrangement is comprised of an array of identically fashioned transmitter antennas that are separated axially and/or in the circumferential direction from one another. They can be individually activated by the control and evaluation device.

A magnetic resonance system having a number of receiving antennas that can be individually activated is known from U.S. Pat. No. 5,216,367.

A magnetic resonance system in which the transmitting antenna is fashioned as a modified birdcage resonator is known from U.S. Pat. No. 5,642,048.

From the scientific paper "Reduction of RF Penetration Effects in High Field Imaging" by Thomas K. F. Foo, Cecil E. Hayes and Yoon-Won Kang, appearing in Magnetic Resonance in Medicine 23 (1992), issue 2, pages 287 through 301, it is known to change the dielectric coupling of the radio-frequency shield of a whole-body transmitting antenna in order to achieve an optimally homogenous radio-frequency field within an excitation volume.

SUMMARY OF THE INVENTION

An object of the present invention is to achieve a simply fashioned magnetic resonance system in which the excitation field is optimally homogenous in spite of a strong basic magnetic field in the examination subject.

The object is achieved by a magnetic resonance system of the type initially described, also having at least one control element as described above, wherein the control and evaluation unit causes the excitation current flowing in the secondary transmitting antenna to exhibit a smaller amplitude than the excitation current flowing in the primary transmitting antenna, and wherein the excitation field generated by the secondary transmitting antenna exhibits a smaller spatial extent than the excitation field generated by the primary transmitting antenna.

The secondary transmitting antenna thus preferably acts only locally for the correction of the excitation field generated by the primary transmitting antenna. By this design, the excitation field generated by the primary transmitting antenna can be specifically and actively homogenized. Thus the (at least one) control element is activated such that the superimposition of the excitation fields is optimally homogenous in the examination subject given an examination subject introduced into the examination region.

It is possible for the secondary transmitting antenna to be operated completely independent of the primary transmitting antenna. Preferably, however, it is inductively coupled with the primary transmitting antenna.

A control signal, on which the activation of the control element is dependent, can be provided to the control and evaluation device, allowing an adaptation to the examination subject. The control signal, for example, can be implicitly determined by body size and weight (possibly also further characteristics) of a patient to be examined. The activation alternatively can be determined by tests.

In individual cases, the secondary transmitting antenna can also be operated dependent on the control signal, such that it is not resonant at the magnetic resonance frequency that is being employed and does not charge the examination region with an excitation field. The secondary transmitting antenna thus also can be completely deactivated in the individual case.

The control element is fashioned as an adjustable impedance, allowing the amplitude ratio and/or phase offset of the excitation currents to be particularly flexibly adjusted.

The excitation current flowing in the secondary transmitting antenna can exhibit a phase offset between −180° and +180° relative to the excitation current flowing in the primary transmitting antenna.

The secondary transmitting antenna can be connected with the control and evaluation device such that it cannot be used for the reception of the magnetic resonance signals. In this case, the secondary transmitting antenna is thus exclusively used for the homogenization of the excitation field. However, it is also possible for the secondary transmitting antenna also to be used for reception of the magnetic resonance signals. In this case it is preferably fashioned as a local coil of the type typically used for the local reception of magnetic resonance signals. In particular in this case, upon reception of magnetic resonance signals the secondary transmitting antenna can be tuned by the control and evaluation device such that it is resonant at the employed magnetic resonance frequency.

DESCRIPTION OF THE DRAWINGS

FIG. 1 is a block diagram of a magnetic resonance system constructed in accordance with the principles of the present invention.

FIG. 2 illustrates a primary transmitting antenna and a secondary transmitting antenna in accordance with the invention.

FIG. 3 illustrates another embodiment of a secondary transmitting antenna in accordance with the invention.

FIG. 4 illustrates a further embodiment of a primary transmitting antenna and a secondary transmitting antenna in accordance with the invention.

DESCRIPTION OF THE PREFERRED EMBODIMENTS

As shown in FIG. 1, a magnetic resonance system has an examination volume 1. An examination subject, here a person 3, can be introduced into the examination volume 1 by means of a patient bed 2.

The examination volume 1 is charged with a basic magnetic field by means of a basic field magnet 4. The base magnetic field is temporally constant (static) and spatially as homogenous as possible. It exhibits a magnetic field strength that is greater than 1.5 T, preferably 3 T or more.

The basic field magnet 4 is preferably is a superconducting magnet. No further activation and/or linkage via the control and evaluation device 5 is thus necessary.

The magnetic resonance system also has a gradient system 6 by means of which the examination volume 1 can be charged with gradient magnetic fields. The gradient system 6 can be activated by the control and evaluation device 5 such that gradient currents flow in the gradient system 6.

The magnetic resonance system also has a primary antenna 7 and a secondary antenna 8. The primary antenna 7 is fashioned as a whole-body antenna. In contrast, the secondary antenna 8 is fashioned as a local coil. It thus acts only locally. The antennas 7, 8 can be activated by the control and evaluation device 5 such that excitation currents flow in the antennas 7, 8.

The examination region 1 can be charged with a radio-frequency excitation field by means of the primary antenna 7. When the examination subject 3 is located in the examination volume 1, the examination subject 3 can thus be excited to magnetic resonances. The magnetic resonance signals thus generated are then alternatively receivable by means of the primary antenna 7 or the secondary antenna 8. Both antennas 7, 8 thus represent receiving antennas 7, 8 of the magnetic resonance system. The received magnetic resonance signals can be supplied to the control and evaluation device 5 and evaluated therein in a known manner.

Due to the high basic magnetic field of 3 T and more, it s not possible in all cases to generate a homogenous excitation field in the entire examination subject 3 by means of only the primary antenna 7. Therefore the secondary antenna 8 can also be activated by the control and evaluation device 5 such that it likewise at least locally charges the examination subject 3 with a radio-frequency excitation field. However, the excitation field generated by the secondary antenna 8 exhibits a smaller spatial extent than the excitation field generated by the primary antenna 7. The excitation current flowing in the secondary antenna 8 also exhibits a smaller amplitude than the excitation current flowing in the primary antenna 7.

As shown in FIG. 2, the secondary antenna 8 can be activated by the control and evaluation device 5 independent of the primary transmitting antenna 7. The control and evaluation device 5 thus itself represents a control element by means of which an amplitude ratio and/or a phase offset of the excitation currents flowing in the antennas 7, 8 can be adjusted.

The activation of the secondary antenna 8 can ensue via the control and evaluation device 5 such that the phase offset is between −180° and +180°. It is thus arbitrarily adjustable. The amplitude ratio is also—within the design limits of the secondary antenna 8—arbitrarily adjustable. In particular the secondary antenna 8 can be operated in the individual case such that it does not charge the examination region 1 with an excitation field. In this case the excitation current flowing in the secondary antenna 8 thus has the value 0.

A control element 9 is arranged in the secondary antenna 8. If it is intended that the secondary antenna 8 should not charge the examination region 1 with an excitation field, the secondary antenna 8 is detuned by means of the control element 9 such that it is not resonant at the magnetic resonance frequency.

The activation of the secondary antenna 8 ensues dependent on a control signal S that is externally predetermined for the control and evaluation device 5 by a user. The activation of the control element 9 is thus dependent on the control signal S.

According to FIG. 3, the control element 9 exhibits a number of capacitors 10 and a parallel oscillating circuit 11. One of the capacitors 10 or the parallel oscillating circuit 11 is switched on via a switch 12, dependent on the control signal S. The control element 9 is thus fashioned as an adjustable impedance 9.

Upon activation of one of the capacitors 10—depending on the connected capacitor 10—an increase or an attenuation of the excitation field generated by the primary transmitting antenna 7 or an exact tuning of the secondary antenna 8 to the magnetic resonance frequency ensues. The tuning to the magnetic resonance frequency is only effected in the event of reception.

If the parallel oscillating circuit 11 is connected, the secondary antenna 8 is detuned such that it can no longer be excited in the magnetic resonance frequency. This corresponds to a deactivation of the secondary antenna 8 when this should thus not be used at all in the transmitting and receiving case.

The representation according to FIG. 4 generally corresponds to that of FIG but, in FIG. 4 no separate excitation of the secondary antenna 8 ensues. Rather, an inductive coupling M exists between the antennas 7, 8. The secondary antenna 8 is thus inductively coupled with the primary antenna 7. In this case, not only does an adjustment of the resonance frequency of the secondary antenna 8 ensue by means of the control element 9, but rather with the adjustment of the resonance frequency an adjustment of amplitude and phase offset of the excitation current flowing in the secondary antenna 8 ensues relative to the excitation current flowing in the primary antenna 7.

Both in the embodiment according to FIG. 2 and in the embodiment according to FIG. 4, the activation of the control element 9 and—directly or indirectly—the secondary antenna 8 ensues such that the superimposition of the excitation fields is optimally homogenous in the examination subject 3.

When receipt of magnetic resonance signals by the secondary antenna 8 is desired, it is always tuned by the control and evaluation device 5 such that it is resonant at the magnetic resonance frequency.

In the above it has been specified that the secondary antenna 8 is used both to charge the examination region 1 with an excitation field and to receive magnetic resonance signals. Naturally it is also possible to use the secondary antenna 8 exclusively to charge the examination region 1 with an excitation field. In this case the secondary antenna 8 is thus not used to receive magnetic resonance signals.

In spite of the high basic magnetic field, a nearly completely homogenous excitation field is thus realizable in a simple manner by means of the inventive magnetic resonance examination system.

Although modifications and changes may be suggested by those skilled in the art, it is the invention of the inventors to embody within the patent warranted heron all changes and modifications as reasonably and properly come within the scope of their contribution to the art.

We claim as our invention:

1. A magnetic resonance system comprising:
   a basic field magnet that generates a homogenous, static basic magnetic field in an examination volume;
   a gradient system operable to superimpose at least one gradient magnetic field on said basic magnetic field in said examination volume;
   a primary RF transmitting antenna operable with an excitation current to generate an RF excitation field in said examination volume;
   a secondary RF transmitting antenna operable with an excitation current to generate an RF excitation field in said examination volume;
   an RF receiving antenna operable to receive magnetic resonance signals from said examination volume produced by magnetic resonance in an examination subject adapted to be disposed in said examination volume;
   a control element electrically connected to one of said primary and secondary RF transmitting antennas allowing setting of at least one of an amplitude ratio and a phase offset of the respective excitation currents in the primary and secondary transmitting antennas; and
   a control and evaluation unit connected to said gradient system, said primary and secondary RF transmitting antennas, and said RF receiving antenna, for operating said gradient system to generate said gradient magnetic fields and for operating said primary and secondary RF transmitting antennas, and said at least one control element, to generate the respective excitation currents in the primary and secondary RF transmitting antennas, and for evaluating the magnetic resonance signals received by said RF receiving antenna, said control and evaluation unit causing the excitation current in the secondary RF transmitting antenna to have a smaller amplitude than the excitation current in the primary RF transmitting antenna, for causing the RF excitation field generated by the secondary RF transmitting antenna to exhibit a smaller spatial extent than the RF excitation field generated by the primary RF transmitting antenna.

2. A magnetic resonance system as claimed in claim 1 wherein said control and evaluation unit activates said at least one control element for causing a superimposition of the respective RF excitations fields in the examination subject in the examination volume to be substantially homogenous.

3. A magnetic resonance system as claimed in claim 1 wherein said secondary RF transmitting antenna is inductively coupled with said primary RF transmitting antenna.

4. A magnetic resonance system as claimed in claim 1 wherein said control and evaluation unit generates a control signal to said at least one control element for activating said at least one control element dependent on said control signal.

5. A magnetic resonance system as claimed in claim 4 wherein said control and evaluation unit also supplies said control signal to said secondary RF transmitting antenna, for causing said secondary RF transmitting antenna not to be resonant at a magnetic resonance frequency employed for generating said magnetic resonance signals in the examination subject, so that said examination subject is not charged with an RF excitation field from said secondary RF transmitting antenna.

6. A magnetic resonance system as claimed in claim 1 wherein said control element comprises an adjustable impedance.

7. A magnetic resonance system as claimed in claim 1 wherein said control and evaluation unit controls the excitation current in said secondary RF transmitting antenna to have a phase offset between −180° and +180° relative to the excitation current in the primary RF transmitting antenna.

8. A magnetic resonance system as claimed in claim 1 wherein said secondary RF transmitting antenna is operated by said control and evaluation unit to be insensitive for receiving said magnetic resonance signals.

9. A magnetic resonance system as claimed in claim 1 wherein said control and evaluation unit operates said secondary RF transmitting antenna to serve as said RF receiving antenna.

10. A magnetic resonance system as claimed in claim 9 wherein said control and evaluation unit operates said secondary RF transmitting antenna to serve as said RF receiving antenna by tuning said secondary RF transmitting antenna to be resonant at a magnetic resonance frequency used to produce said magnetic resonance signals.

* * * * *